United States Patent
Song et al.

(10) Patent No.: US 6,734,707 B2
(45) Date of Patent: May 11, 2004

(54) DATA INPUT CIRCUIT FOR REDUCING LOADING DIFFERENCE BETWEEN FETCH SIGNAL AND MULTIPLE DATA IN SEMICONDUCTOR DEVICE

(75) Inventors: Ho-young Song, Yongin (KR);
Kyu-hyoun Kim, Suwon (KR);
Su-bong Jang, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/340,831

(22) Filed: Jan. 13, 2003

(65) Prior Publication Data

US 2003/0160289 A1 Aug. 28, 2003

(30) Foreign Application Priority Data

Jan. 11, 2002 (KR) ............................ 2002-1775
Jul. 4, 2002 (KR) ............... 10-2002-0038738

(51) Int. Cl.$^7$ ................................ H03M 7/00
(52) U.S. Cl. ........................ 327/141; 327/198
(58) Field of Search ................ 327/141, 199, 327/200, 218; 365/189.05, 190, 233

(56) References Cited

U.S. PATENT DOCUMENTS 5,489,901 A * 2/1996 Fukuda et al. ............ 341/78
5,715,198 A * 2/1998 Braceras et al. ........ 365/189.05
6,169,435 B1 * 1/2001 Fujii et al. .................. 327/261

FOREIGN PATENT DOCUMENTS

JP    56125132 A   * 10/1981
JP    409311742    * 12/1997

* cited by examiner

Primary Examiner—Dinh T. Le
(74) Attorney, Agent, or Firm—Harness Dickey (57) ABSTRACT

A data input circuit for use in a semiconductor device, the data input circuit reducing a load difference between a fetch signal and a plurality of groups of data. The data input circuit includes first through $N^{th}$ latching units for latching each one of N groups of data in response to a reference clock, respectively (N is a natural number greater than 2), and a bus for transmitting the reference clock and the N groups of data to the first through $N^{th}$ latching units. Each of the first through $N^{th}$ latching units includes a clock buffer for buffering the reference clock; a data buffer for buffering a corresponding group of data of the N groups of data; N−1 dummy elements for respectively receiving each one of the N groups of data, except for the group of data input to the data buffer; and latches for latching data output from the data buffer in synchronization with a signal output from the clock buffer. Use of the data input circuit makes a load on a reference clock the same or substantially the same as that on each group of data. Therefore, a load difference between the reference clock and each group of data is reduced to reduce a skew therebetween.

29 Claims, 7 Drawing Sheets

DATA INPUT CIRCUIT FOR REDUCING LOADING DIFFERENCE BETWEEN FETCH SIGNAL AND MULTIPLE DATA IN SEMICONDUCTOR DEVICE

BACKGROUND OF THE INVENTION

This nonprovisional patent application claims priority upon Korean Patent Application Nos. 2002-1775 and 2002-38738, filed Jan. 11, 2002 and Jul. 4, 2002, respectively, the contents of each of which are hereby incorporated by reference in their entirety.

FIELD OF THE INVENTION

The present invention relates to a semiconductor integrated circuit, and more particularly, to a semiconductor device to which multiple data can be input to and output from contemporaneously.

DESCRIPTION OF THE RELATED ART

An increase in requests for semiconductor devices operating at a high speed results in an increase in the development of semiconductor devices which allows several groups of data, indicated as x N (where N is 4, 8, 16, etc.) in various standards, to be input to and output from at the same time. Such a semiconductor device which allows data of N bits to be input to and output from at the same time, is referred to as a semiconductor device whose bit organization is N.

N groups of data input to a semiconductor device whose bit organization is N, are latched in response to one fetch signal and then are fetched to an inner circuit of the semiconductor device. Thus a data input circuit is required in the semiconductor device to latch the N groups of input data.

Figure 1:
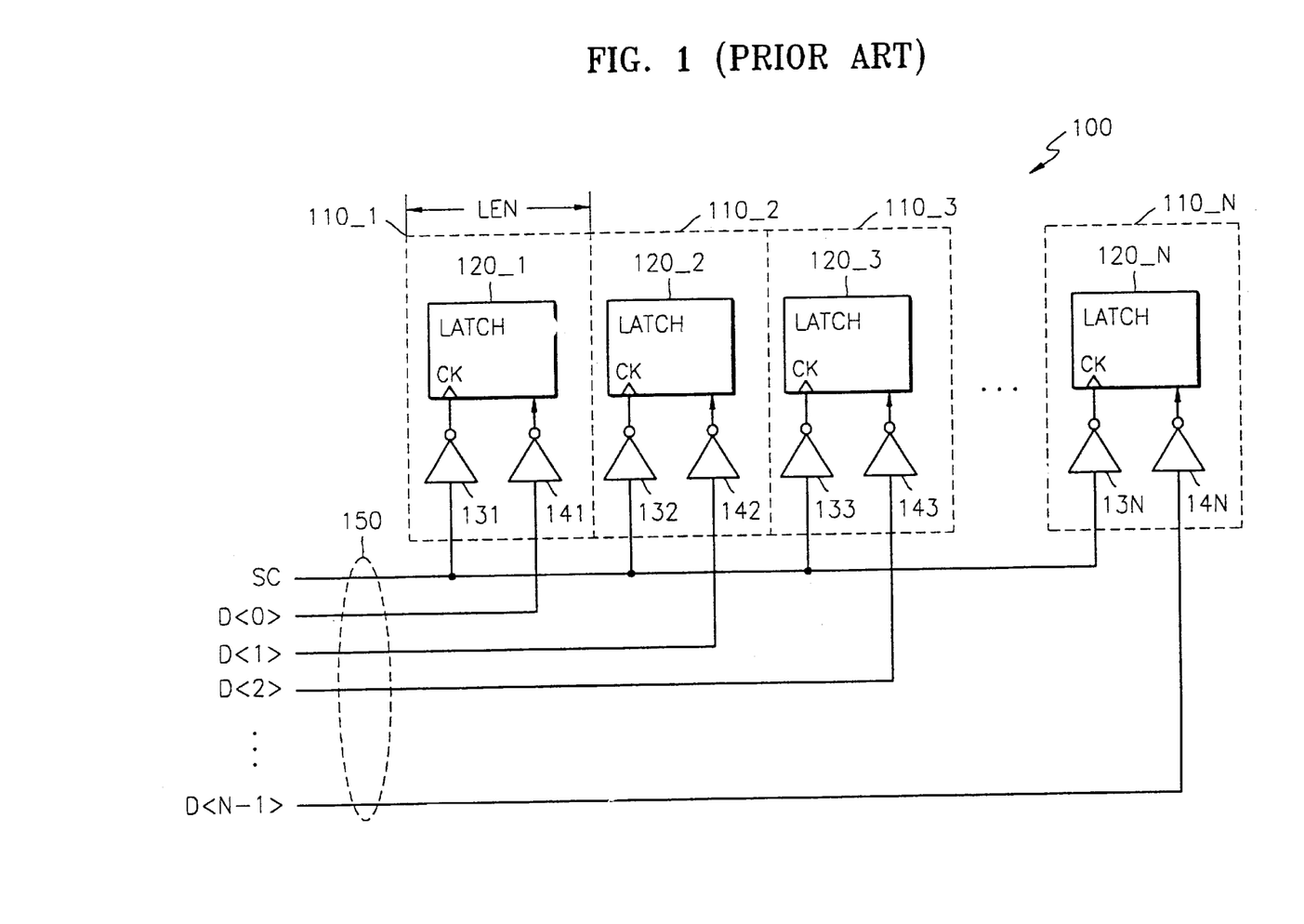
FIG. 1 is a circuit diagram a conventional data input circuit for use in a semiconductor device.

FIG. 1 is a circuit diagram of a conventional data input circuit 100 for use in a semiconductor device. Referring to FIG. 1, the conventional data input circuit 100 includes N latching units 110_i (where i is an integer from 1 to N).

A reference clock SC and one of a plurality of groups of data D<0> through D<N−1> are input to each latching unit 110_i, respectively. In detail, the N groups of data D<0>, D<1>, . . . , D<N−1> are input to a first latching unit 110_1, a second latching unit 110_2, . . . , and an N$^{th}$ latching unit 110_N, respectively.

The reference clock SC is input to the latch 120_i of each latching unit 110_i as a clock terminal CK (i is an integer from 1 to N). Then, each latch 120_i latches input data D<j> in response to the reference clock SC (j is an integer from 0 to N−1).

The reference clock SC and the data D<j> pass through a clock buffer 13$i$ and a data buffer 14$i$, respectively, before being input to the latch 120_i (i is an integer from 1 to N). In general, the clock buffer 13$i$ and the data buffer 14$i$ are composed of conventional inverters.

However, the reference clock SC is input to all latching units 110_i, and each group of data D<0>, D<1>, . . . , and D<N−1> is input only to a corresponding latching unit 110_i. That is, the first group of data D<0>, the second group of data D<1>, and the other data D<j> are input to the first latching unit 110_1, the second latching unit 110_2, and the N$^{th}$ latching unit 110_i, respectively, thereby generating a loading difference between the reference clock SC and each data D<0>, D<1>, . . . , and D<N−1>. Examples of loading include a gate loading caused by a buffer and a bus loading caused by a bus 150 through which signals are transmitted.

Assuming that the clock buffer 13$i$ and the data buffer 14$i$ to which the reference clock SC and each group of data D<0>, D<1>, . . . , and D<N−1> are input are designed to have the same structure and size, the loading difference between the reference clock SC and each data D<j> with respect to the input terminal of each buffer 13$i$ and 14$i$, may be modeled as 'Cin', where 'Cin' denotes a capacitive loading of the buffers 13$i$ and 14$i$. In other words, a gate loading generated by one buffer 13$i$ or 14$i$ can be modeled as Cin (i is 1 through N). Further, a bus loading caused by the bus 150, which corresponds to the length LEN of a latching unit, can be roughly modeled as $L_{13}$ LEN. In general, a bus is made of a metal line, and thus, the bus loading contains a capacitive loading and a resistive loading.

FIG. 1, there is little difference between the gate loadings of the reference clock SC and the first group of data D<0> input to the first latching unit 110_1. However, the bus of the reference clock SC is N times longer than the bus to which the first group of data D<0> is transmitted, and thus, the difference between these bus loadings is (N−1)*L_LEN. Also, in the case of the reference clock SC and the N$^{th}$ groups of data D<N−1> input to the N$^{th}$ latching unit 110_N, the lengths of their buses are almost the same and the differences between the loadings of their buses are minimal. However, the clock signal SC is connected to N buffers and the N$^{th}$ group of data D<N−1> are connected to one buffer, and thus a difference of the gate loadings therebetween is (N−1)*Cin.

Accordingly, in the worst case, the difference between the gate loadings of the reference clock SC and one of the N groups of data D<0> through D<N−1> is {(N−1)*Cin}+{(N−1)*L_LEN}.

If there is a difference between loadings of the reference clock SC and the N$^{th}$ group of data D<N−1> as described above, a delay time in the reference clock SC is different from that in the N$^{th}$ group of data D<N−1>. As a result, the time of inputting data D<0> through D<N−1> differs with respect to the reference clock SC when the data input circuit 100 latches N groups of data D<0> through D<N−1>. Thus, skew may occur between the reference clock SC and each data D<j> in a conventional data input circuit, thereby causing malfunction of the data input circuit or degradation of the speed of operation of a semiconductor device (j is an integer from 0 through N−1).

SUMMARY OF THE INVENTION

In an exemplary embodiment, the present invention provides a data input circuit capable of latching several groups of data at once, and in which there is less or no difference between loadings of a reference clock and each group of data, thereby reducing the occurrence of skew.

In an exemplary embodiment, the present invention is directed to a data input circuit of a semiconductor device for latching a plurality of groups of data in response to a reference clock, the data input circuit comprising first through N$^{th}$ latching units for latching each one of N groups of data in response to the reference clock, respectively, wherein N is a natural number greater than 2; and a bus for transmitting the reference clock and the N groups of data to the first through N$^{th}$ latching units, wherein each of the first through N$^{th}$ latching units includes a clock buffer for buffering the reference clock, a data buffer for buffering a corresponding group of data of the N groups of data, N−1 dummy elements for respectively receiving each one of the N groups of data, except for the corresponding group of data input to the data buffer, and a latch for latching data output from the data buffer in synchronization with a signal output from the clock buffer.

In an exemplary embodiment, each of the dummy elements has the same or substantially the same capacitance as the clock buffer. In an exemplary embodiment, each of the dummy elements is a buffer having the same structure and size as the clock buffer and the data buffer. In an exemplary embodiment, each of the dummy elements is a capacitor that is formed between the bus and a grounding voltage.

In an exemplary embodiment, the present invention is directed to a data input circuit of a semiconductor device for latching a plurality of groups of data in response to a reference clock, the data input circuit comprising first through $N^{th}$ latching units for respectively latching each one of N groups of data in response to the reference clock, wherein N is a natural number greater than 2, and a bus for transmitting the reference clock and the N groups of data to the first through $N^{th}$ latching units, wherein each of the first through $N^{th}$ latching units includes a clock buffer for buffering the reference clock, a data buffer for buffering a corresponding group of data out of the N groups of data, N−1 dummy buffers for respectively buffering each one of the N groups data except for the corresponding group of data input to the data buffer, and a latch for latching data output from the data buffer in synchronization with a signal output from the clock buffer.

In an exemplary embodiment, each of the dummy buffers has the same structure and size as the clock buffer and the data buffer.

In an exemplary embodiment, the present invention is directed to a data input circuit comprising a plurality of data input buffers for buffering external data and outputting a plurality of groups of data that are divided into at least two sub data groups, a strobe signal input buffer for buffering a data strobe signal and generating at least two sub clocks, latching units for latching one group of data belonging to a corresponding sub data group of the at least two sub data groups in synchronization with the corresponding clock, and receiving other groups of data, except for the one group of data, as dummy data, and a bus for transmitting the at least two sub clocks and the at least two groups of sub data to a corresponding latching unit.

In an exemplary embodiment, the present invention is directed to a data input circuit comprising a plurality of data input buffers for buffering external data and outputting a plurality of groups of data, a strobe signal input buffer for buffering a data strobe signal and generating first through $M^{th}$ sub clocks (M is a natural number greater than 2), latching units for latching one of the plurality of groups of data in synchronization with the first through $M^{th}$ sub clocks, and receiving several groups of data of the plurality of groups of data as dummy data, and a bus for transmitting the first through the $M^{th}$ sub clocks and the plurality of groups of data to the latching units, wherein the latching units are divided into first through $M^{th}$ sub latch groups so as to divide the plurality of groups of data into first through $M^{th}$ sub data groups and latch the plurality of groups of data per sub data group (M is a natural number greater than 2), and the bus transmits the plurality of groups of data to the first through $M^{th}$ sub latch groups, the plurality of groups of data is latched per sub data group.

In an exemplary embodiment, each latching unit includes a latch for latching a group of data belonging to a corresponding sub data group; and a dummy input unit receiving other groups of data except for the one group of data belonging to the corresponding sub data group.

In an exemplary embodiment, the present invention is directed to a data input circuit of a semiconductor device for latching a plurality of groups of data in response to a reference clock, the data input circuit comprising first through $N^{th}$ latching units for latching each one of N groups of data in response to the reference clock, respectively, wherein N is a natural number greater than 2 and a bus for transmitting the reference clock and the N groups of data to the first through $N^{th}$ latching units, wherein each of the first through $N^{th}$ latching units includes a clock buffer for buffering the reference clock, a data buffer for buffering a corresponding group of data of the N groups of data, N−1 load balancers for respectively receiving each one of the N groups of data, except for the corresponding group of data input to the data buffer, and a latch for latching data output from the data buffer in synchronization with a signal output from the clock buffer.

BRIEF DESCRIPTION OF THE DRAWINGS

The above object and advantages of the present invention will become more apparent by describing in detail exemplary embodiments thereof with reference to the attached drawings in which.

DETAILED DESCRIPTION OF THE INVENTION

Figure 2:
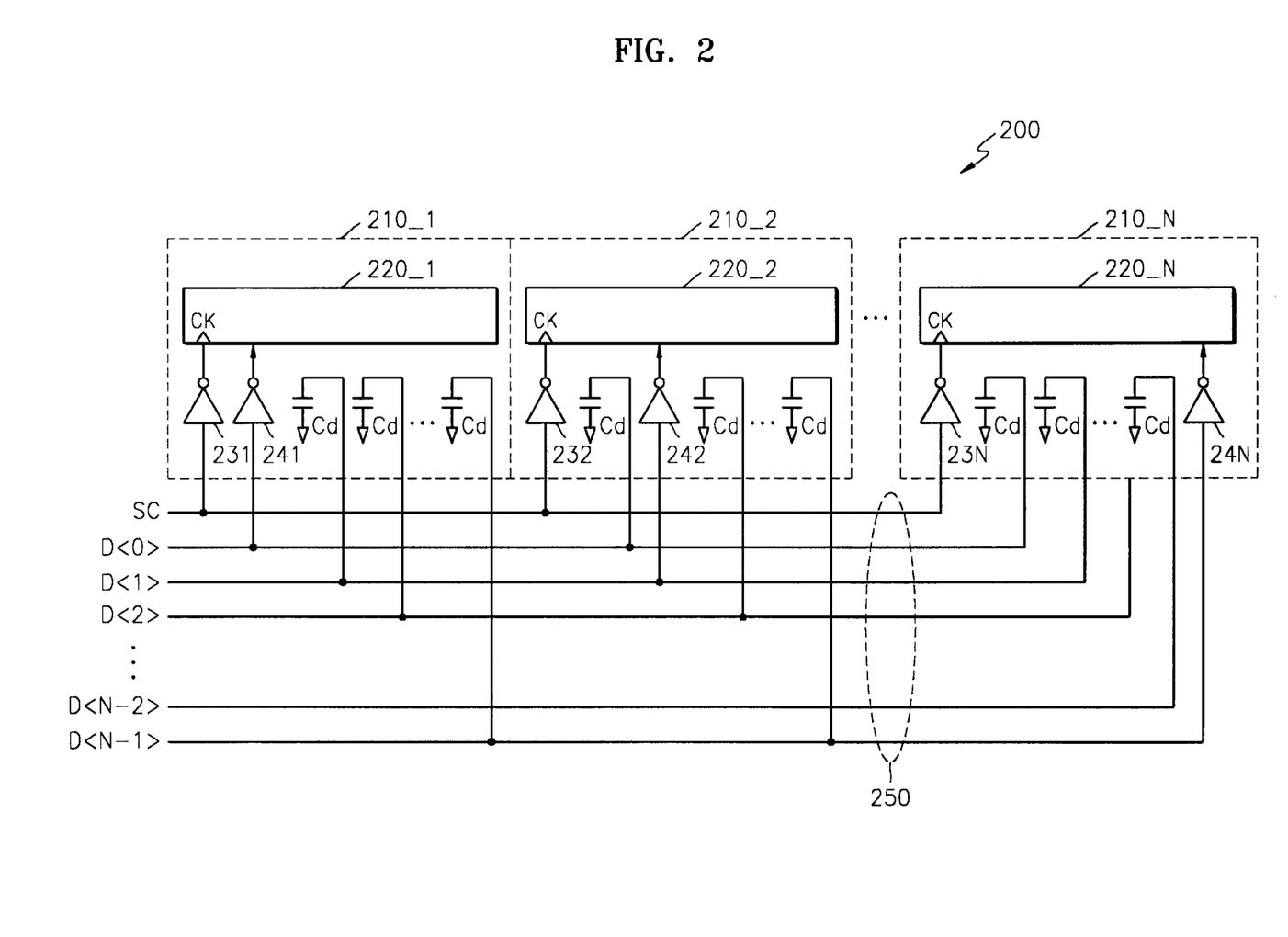
FIG. 2 is a circuit diagram of a data input circuit according to an exemplary embodiment of the present invention.

FIG. 2 is a circuit diagram of a data input circuit 200 according to an exemplary embodiment of the present invention. Referring to FIG. 2, the data input circuit 200 includes N latching units 210_i and a bus 250, where i is an integer from 1 to N, and N is a natural number greater than 2. For convenience, the N latching units 210_i will now be described as first through $N^{th}$ latching units 210_i.

Each of the first through $N^{th}$ latching units 210_1 through 210_N latches one of N groups of data D<0> through D<N−1> in response to a reference clock SC. In particular, the first latching unit 210_1 latches the first group of data D<0>, the second latching unit 210_2 latches the second group of data D<1>, and the remaining latching units 210_i latch corresponding groups of data, respectively (i is an integer from 3 to N). The reference clock SC may be a signal input via a clock pin (not shown) of a semiconductor device, and may be used as a fetch signal when fetching N groups of data. In an exemplary embodiment, one group of data includes one bit. Thus, the N groups of data D<0> through D<N−1> include N bits.

The bus 250 transmits the reference clock SC and data D<j> input via outer pins of a semiconductor device, and data D<j> to the first through $N^{th}$ latching units 210_i, respectively, where j is an integer from 0 to N_1 and i is an integer from 1 to N.

In an exemplary detailed configuration of the first through $N^{th}$ latching units 210_i, each of these latching units 210_i may include a clock buffer 23i, a data buffer 24i, N−1 dummy elements Cd and a latch 220_i.

The clock buffers 23i buffer the reference clock SC, and the data buffers 24i buffer a corresponding group of data out of N groups of data D<j> (i is an integer from 1 through N and j is an integer 0 through N−1). That is, the data buffer 241 of the first latching unit 210_1 buffers the first group of data D<0>, and the data buffer 242 of the second latching unit 210_2 buffers the second group of data D<1>. Also, the buffers 24i of the other latches 210_i buffer corresponding groups of the data, respectively (i is an integer from 3 to N).

Each dummy element Cd receives the N groups of data, except for a group of data input to the data buffer 24i of a latching unit 210_i to which the dummy element Cd belongs. For example, the N−1 dummy elements Cd of the first latching unit 210_1 receive the second through $N^{th}$ groups of data D<j>, respectively (j is an integer from 1 to N−1). The N−1 dummy elements Cd of the second latching unit 210_2 receive the first group of data D<0> and the third through $N^{th}$ groups of data D<j>, respectively (j is an integer from 2 to N−1). Similarly, the dummy elements Cd of the third through $N^{th}$ latching units 210_i receive corresponding groups of data, respectively (i is an integer from 3 to N).

In an exemplary embodiment, each dummy element Cd is a capacitor having the same or substantially the same capacitance as the clock buffer 23i (i is an integer from 1 to N).

The latch 220_i latches data output from the data buffer 24i in synchronization with a signal output from the clock buffer 23i (i is an integer from 1 to N). That is, the latch 220_1 of the first latching unit 210_1 latches the first group of data D<0>, and the latch 220_2 of the second latching unit 210_2 latches the second group of data D<1>. Likewise, the latches 220_i of the other latching units 210_i latch corresponding groups of data, respectively (i is an integer from 3 to N) as in the data buffers 241 and 242 of the first and second latching units 210_1 and 210_2.

It is assumed that the clock buffer 23i and the data buffer 24i have the same or substantially the same size and/or structure (i is an integer from 1 through N), and each clock buffer 23i and each data buffer 24i have the same or substantially the same capacitance. Also, the value of the capacitance of each clock or data buffer 23i or 24i is determined as 'Cin'. In this case, each dummy element Cd has a capacitance Cin, i.e., each dummy element Cd is a capacitor having the capacitance Cin.

The N−1 dummy elements Cd of the first latching unit 210_1 are capacitors formed between a grounding voltage and each bus that transmits the second through $N^{th}$ groups of data D<j> (j is an integer from 1 through N−1), and the N−1 dummy elements Cd of the second latching unit 210_2 are capacitors formed between a grounding voltage and each bus that transmits the first group of data D<0> and the third through $N^{th}$ groups of data D<j> (j is an integer from 2 through N−1). Similarly, the dummy elements Cd of the third through $N^{th}$ latching units 210_i are capacitors formed between a grounding voltage and each bus that transmits corresponding data (i is an integer from 3 through N). The capacitors which constitute the dummy elements Cd can be variously formed, as would be known to one of ordinary skill in the art.

As described above, a data input circuit according to an exemplary embodiment of the present invention includes the dummy elements Cd whose capacitances are the same or substantially the same as that of the clock buffer 23i (i is an integer from 1 through N). Therefore, a loading difference between the reference clock SC and each data D<j> can be reduced or minimized (j is an integer from 0 through N−1).

Figure 3:
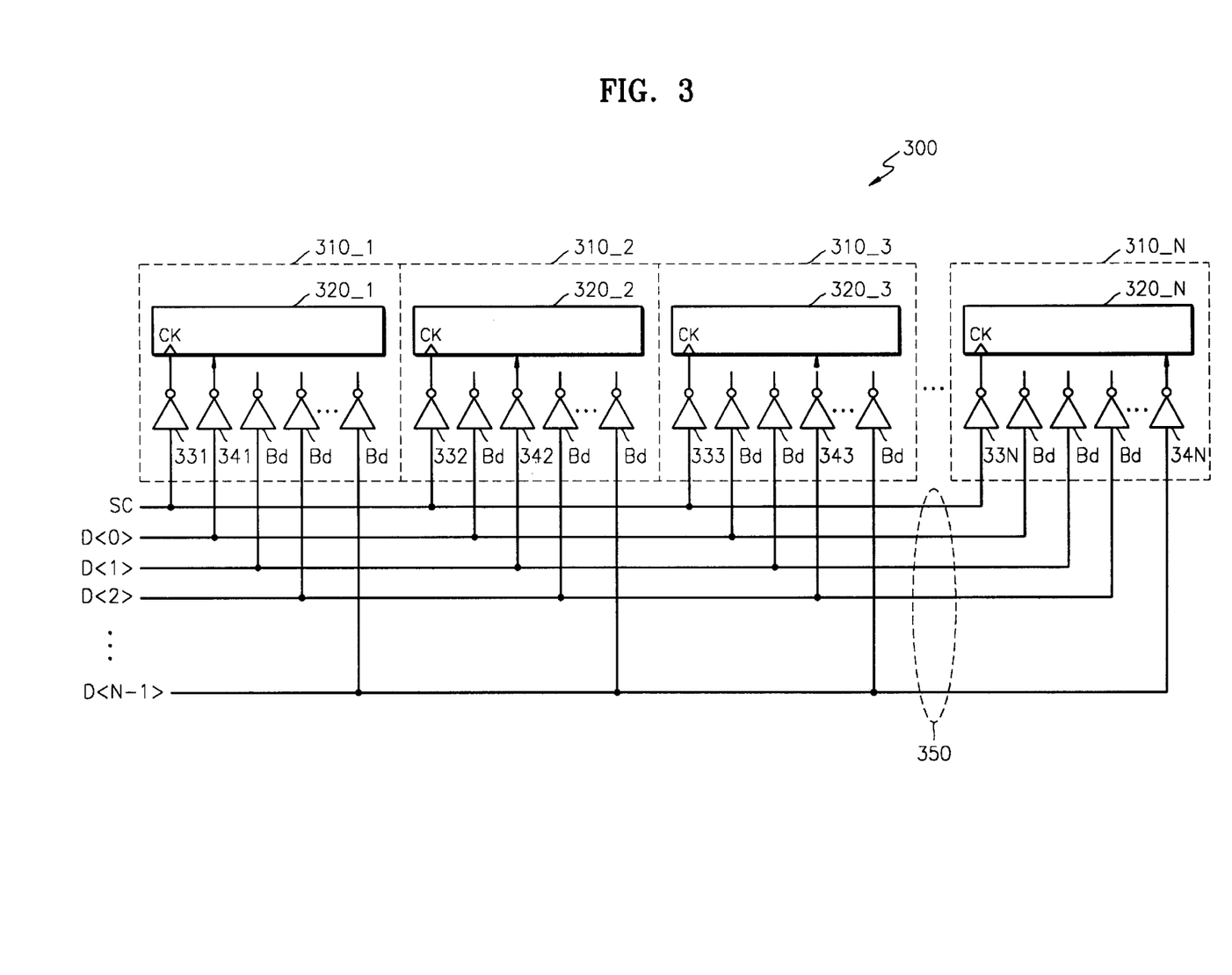
FIG. 3 is a circuit diagram of a data input circuit according to another exemplary embodiment of the present invention.

FIG. 3 is a circuit diagram of a data input circuit 300 according to another exemplary embodiment of the present invention. Referring to FIG. 3, as in the data input circuit 200 according to the previous exemplary embodiment, the data input circuit 300 includes first through $N^{th}$ latching units 310_i and a bus 350. Here, i is an integer from 1 through N, and N is a natural number greater than 2.

In an exemplary embodiment, each of the first through $N^{th}$ latching units 310_i includes a clock buffer 33i, a data buffer 34i, N−1 dummy elements Bd, and a latch $320_{13}$ i.

The clock buffers 33i, the data buffers 34i, the latches 320_i, which are respectively included in one of the first through $N^{th}$ latches 310i and the bus 350, may be the same or substantially the same as the clock buffers 23i, the data buffers 24i, and the latching units 220_1, and the bus 250 which are included in the data input circuit 200. Thus a detailed description of these elements can be omitted. Here, i is an integer from 1 to N.

Each of the dummy elements Bd receives one of the other groups of data except for the group of data that is input to the data buffer 34i to which each of the dummy elements Bd belongs (i is an integer from 1 through N). For example, the N−1 dummy elements Bd of the first latching unit 310_1 receive the second through $N^{th}$ groups of data D<j>, respectively (j is an integer from 1 through N−1), and the N−1 dummy elements Bd of the second latching unit 310_2 receive the first group of data D<0> and the third through $N^{th}$ groups of data D<j>, respectively (j is an integer from 2 to N−1). Also, the dummy elements Bd of the third and $N^{th}$ latching units 310_i receive corresponding group of data, respectively (i is an integer from 3 to N). In an exemplary embodiment, each of the dummy elements Bd is a buffer having the same or substantially the same structure and/or size as the clock buffer 33i and the data buffers 34i (i is an integer from 1 through N). However, data output from the dummy buffer Bd is not input to the corresponding latching unit 310_i.

In an exemplary embodiment, an inverter including at least one pMOS transistor and at least one nMOS transistor can be adopted as a buffer that is used as the dummy elements Bd. The structure of this inverter-type buffer is well known to those skilled in the art and, thus, its detailed description can be omitted here.

Use of the dummy buffers Bd having the same or substantially the same structure and/or size as the clock buffer 33i and the data buffer 34i reduces a loading difference between the reference clock SC and each group of data D<j>. Here, i is an integer from 1 through N, and j is an integer from 0 through N−1. A reduced loading difference between the reference clock SC and each group of data D<j> results in a reduction in the occurrence of skew therebetween.

Figure 4:
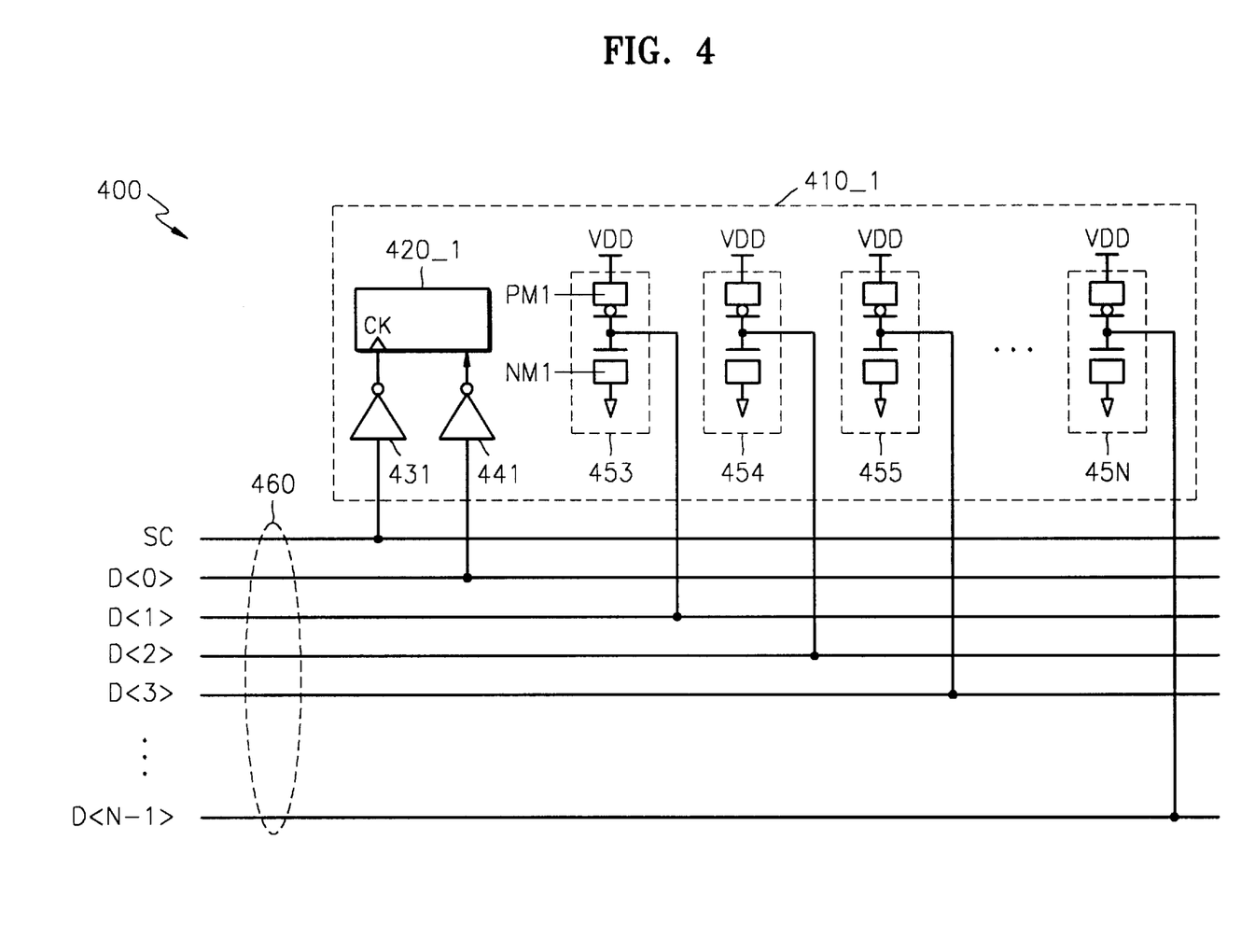
FIG. 4 is a circuit diagram of a data input circuit according to another exemplary embodiment of the present invention.

FIG. 4 is a circuit diagram of a data input circuit 400, according to another exemplary embodiment of the present invention. Referring to FIG. 4, the data input circuit 400 includes first through $N^{th}$ latching units 410_i and a bus 460, as in the data input circuit 200 according to the previous exemplary embodiment (i is an integer from 1 through N). Because the second through $N^{th}$ latching units 410_2 through 410_N have the same structure as the first latching unit 410_1, only the first latching unit 410_1 is illustrated in FIG. 4 for convenience. Here, N is a natural number greater than 2.

The first latching unit 410_1 includes a clock buffer 431, a data buffer 441, N−1 dummy elements 45i, and a latch 420_1 (i is an integer from 3 through N). Each of the second and $N^{th}$ latching units (not shown) includes a clock buffer, a data buffer, N−1 dummy elements, and a latch.

The bus 460, the clock buffer 431, the data buffer 441, and the latch 420_1 are the same as the bus 250, the clock buffer 23i, the data buffer 24i, and the latch 220_i that are included in the data input circuit 200 according to the previous exemplary embodiment (i is an integer from 1 through N). Thus a detailed description of these elements can be omitted here.

Each of the dummy elements 45i receives each group of data D<j>, except for the group of data D<0> input to the data buffer 441 of the latching unit 410_1 to which this dummy element 45i belongs (i is an integer from 3 through N and j is an integer from 1 through N−1). Although not illustrated in the drawings, the N−1 dummy elements of the second latching unit receive the first group of data D<0> and the third through $N^{th}$ groups of data D<j> (j is an integer from 2 through N−1).

In an exemplary embodiment, each of the dummy elements 45i (i is an integer from 3 through N) includes an nPMOS transistor PM1 whose drain and source are connected to a power source voltage VDD and whose gate is connected to the bus 460 that transmits received data, and includes an nMOS transistor NM1 whose drain and source are connected to grounding voltage and whose gate is connected to the bus 460 that transmits received data.

In the case of the first dummy element 453 of the first latching unit 410_1, the gates of the pMOS transistor PM1 and nMOS transistor NM1 of the first dummy element 453 are connected to the bus 460 that transmits the second group of data D<1>. The gates of the pMOS transistor and nMOS transistor of the second dummy element 454 are connected to the bus 460 that transmits the third group of data D<2>. Likewise, gates of the pMOS transistors and nMOS transistors of the other dummy elements 45i (i is an integer from 5 through N) are connected to the bus 460 that transmits received data D<j> (j is an integer from 3 through N−1).

In an exemplary embodiment, each dummy element 45i (i is an integer from 3 through N) has the same or substantially the same capacitance as the clock buffer 431. Although not shown in the drawings, each of the dummy elements of the second through $N^{th}$ latches (not shown) receives a corresponding group of data except for the group of data input to the data buffer of the latching unit to which the second through $N^{th}$ latches belong. Also, each dummy element has the same or substantially the same capacitance as the clock buffer.

Use of the dummy elements of FIG. 4 reduces loading difference between the reference clock SC and each group of data D<j> (j is an integer from 0 through N−1), and results in less power consumption.

Figure 5:
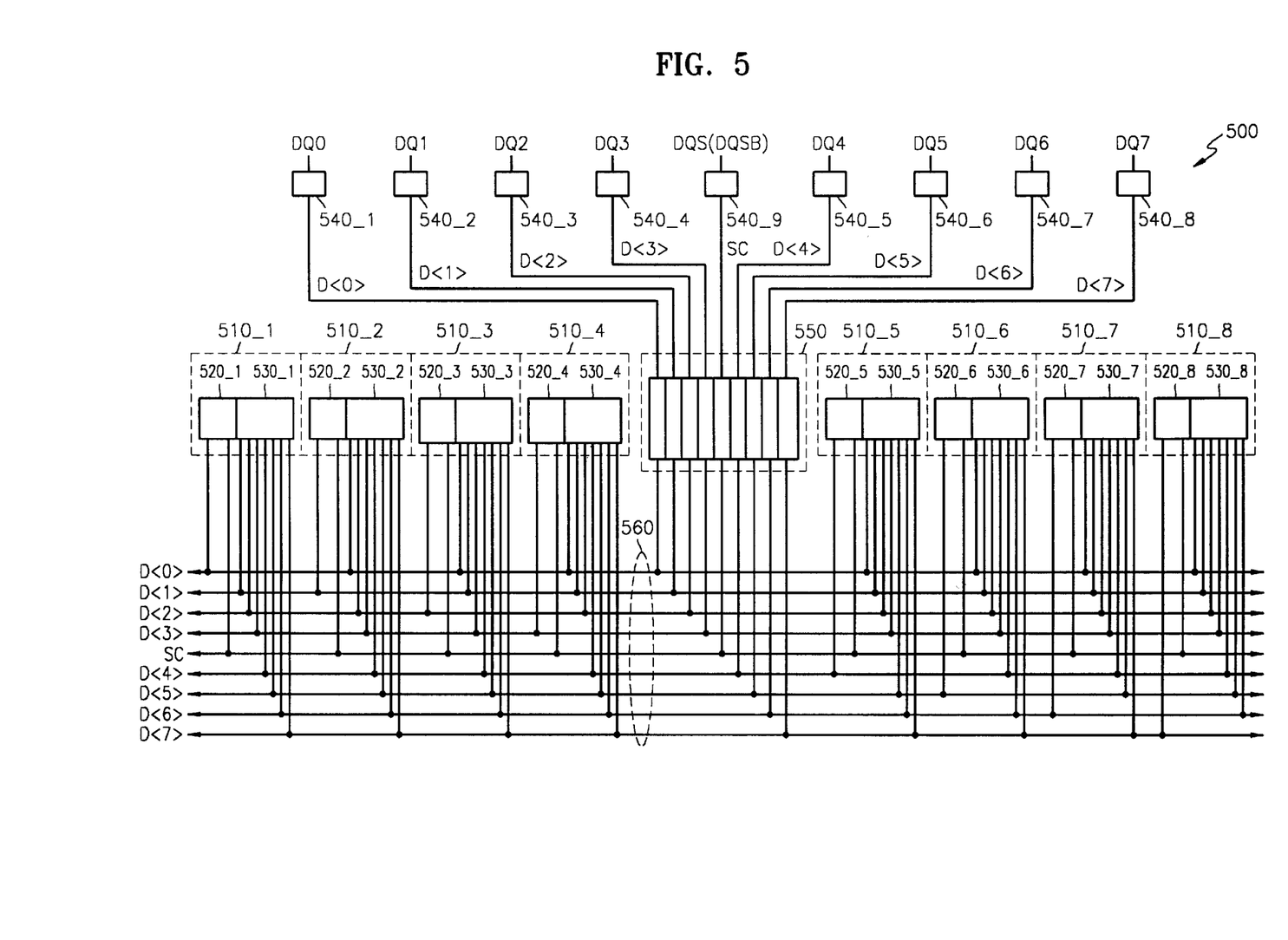
FIG. 5 is a circuit diagram of a data input circuit according to another exemplary embodiment of the present invention.

5 is a circuit diagram of a data input circuit 500 according to another exemplary embodiment of the present invention. Referring to FIG. 5, the data input circuit 500 includes eight latching units 510_i, eight data input buffers 540_i, a strobe signal input buffer 540_9, a repeating unit 550, and a bus 560. Here, i is an integer from 1 through 8.

The data input circuit 500 according to an exemplary embodiment is similar to the data input circuits 200 through 400 of the previous exemplary embodiments. The data input circuit 500 is different from the data input circuits 100 through 400 in that N, which is illustrated in FIGS. 2 through 4, is fixed as eight, i.e., the numbers of some elements such as latching units and latches are determined to be eight. Also, the eight data input buffers 540_i, the strobe signal input buffer 540_9, and the repeater 550 are further included in the data input circuit 500.

The data input buffers 540_i (i is an integer from 1 through 8) buffers first through eighth external data DQ0 through DQ7 input external to a semiconductor device via a pad (not shown) and outputs the result as first through eighth data D<0> through D<N−1>, respectively, which are internal signals. The strobe signal input buffer 540_9 buffers a data strobe signal DQS input externally and outputs it as a reference clock SC which is an internal fetch signal. Otherwise, the strobe signal input buffer 540_9 may buffer the data strobe signal DQS and its inversion signal DQSB so as to generate the reference clock SC.

Inclusion of the data input buffers 540_i (i is an integer from 1 through 8) and the strobe signal input buffer 540_9 into the data input circuits 200 through 400 is also possible, although not specifically shown in the data input circuits 200 through 400 according to the previous exemplary embodiments.

Each of the eight latching units 510_i includes a latch 520_i and a dummy input unit 530_i (i is an integer from 1 through 8). As like in the latches 220_1 through 220_N, the latches 520_i latch a related group of data D<i> in synchronization with the reference clock SC (j is an integer from 0 through 7). In detail, the first latch 520_1, the second latch 520_2, . . . , and the eighth latch 520_8 latch first data D<0>, second data D<1>, . . . , eighth data D<7>, respectively.

The dummy input units 530_i are circuits to which other data, except for data latched by a corresponding latch 520_i, are input as dummy data, respectively (i is an integer from 1 through 8). The dummy input units 530_i are circuits corresponding to the N−1 dummy elements according to the first through third embodiment, shown in FIGS. 2 through 4. That is, the first dummy input unit 530_1 receives other data D<j> (j is an integer from 1 through 7) except for the first data D<0> latched by the first latch 520_1. The second dummy input unit 530_2 receives other data D<j> (j is 0 and an integer from 2 through 7) except for the second data D<1> latched by the second latch 520_1. The dummy input units 530_i may be any of the dummy devices described above in conjunction with other exemplary embodiments.

The repeating unit 550 is a circuit for amplifying data and the reference clock SC when the length of a bus between the latches 510_i and the data input buffers 540_i (i is an integer from 1 through 8) or between the latches 510_i and the strobe signal input buffer 540_9 is long. The repeating unit 550 includes nine repeaters.

In the data input circuit 500 according to an exemplary embodiment, all data D<j> (j is an integer from 0 through 7) and the reference clock SC are input to all of the latches 510_i (i is an integer from 1 through 8), as in the data input circuits 200 through 400 according to previous exemplary embodiments. For this reason, lines 560 for the data D<j> (j is an integer from 0 through 7) and the reference clock SC should be connected to the all of the latches 510_i (i is an integer from 1 through 8). More specifically, the data input circuit 500 requires nine bus lines 560 and all of these bus lines 560 must be input to all of the latches 510_i, so as to latch eight data D<j> with respect to the reference clock SC (i is an integer form 1 through 8 and j is an integer from 0 through 7).

Figure 6:
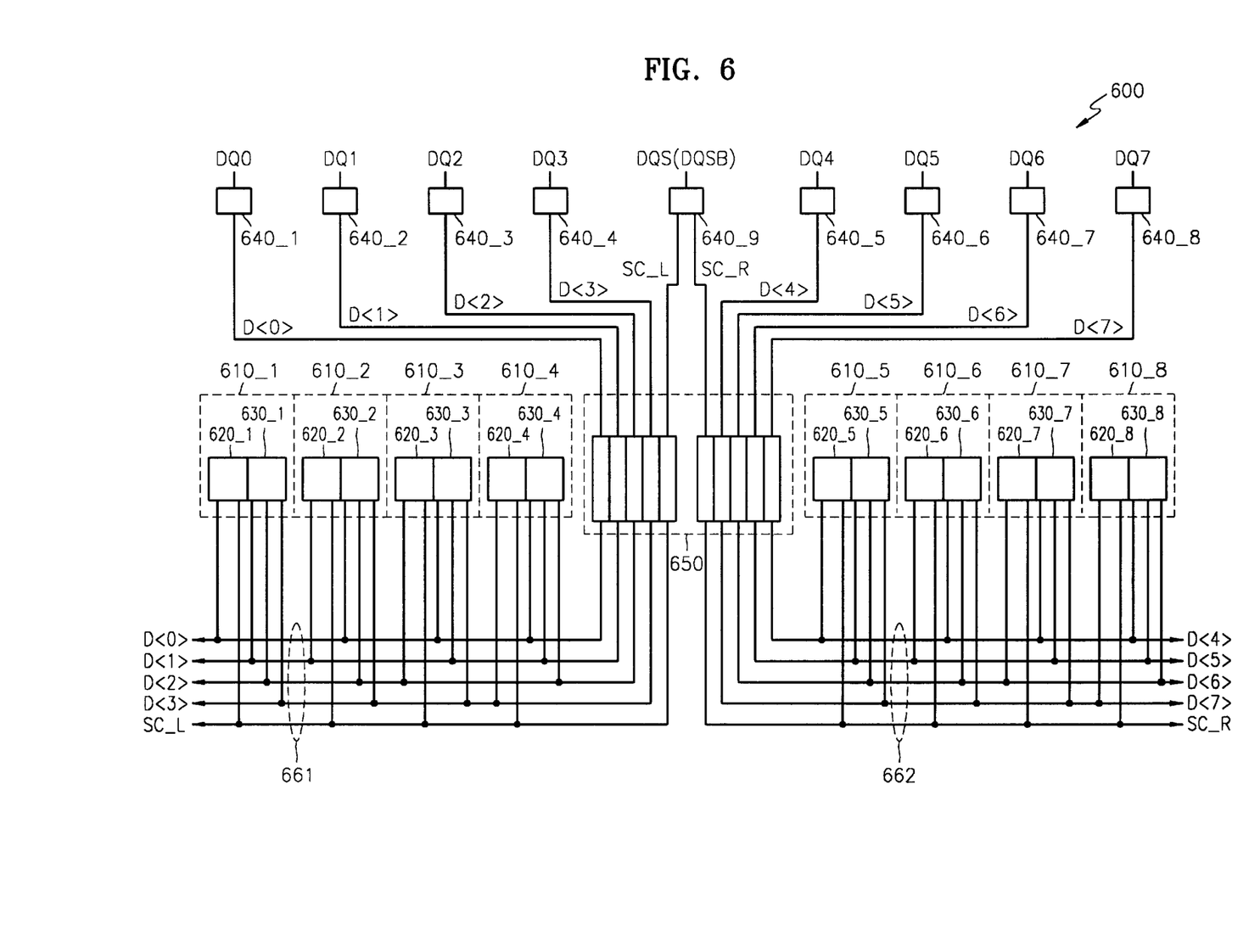
FIG. 6 is a circuit diagram of a data input circuit according to another exemplary embodiment of the present invention.

FIG. 6 is a circuit diagram of a data input circuit 600 according to another exemplary embodiment of the present invention. Referring to FIG. 6, the data input circuit 600 includes eight latching units 610_i (i is an integer from 1 through 8), eight data input buffers 640_i (i is an integer from 1 through 8), a strobe signal input buffer 640_9, a repeater 650, a first bus 661, and a second bus 662. In the case of the data input circuit 600 according to an exemplary embodiment, N shown in FIGS. 2 through 4 is eight.

In an exemplary embodiment, a reference clock SC is divided into two sub clocks SC_L and SC_R, and data D<0> through D<7> are divided into two sub data groups, i.e., D<0> through D<3> of a first sub data group and D<4> through D<7> of a second sub data group. The D<0> through D<3> of the first sub data group and D<4> through D<7> of the second sub data group are latched by the sub clocks SC_L and SC_R, respectively.

A data strobe signal DQS is buffered by the strobe signal input buffer 640_9 and output to the two sub clocks, i.e., the first and second sub clocks SC_L and SC_R.

The data input buffers 640_i (i is an integer from 1 through 8) buffer external data DQ0 through DQ7 and output them as internal signals, i.e., first through eighth data D<j> (j is an integer from 0 through 7). As mentioned, the first through fourth data D<0> through D<3>, and the fifth through eighth data D<4> through D<7> are classified into the first sub data group and the second sub data group, respectively.

Therefore, the first through fourth data D<0> through D<3> are latched in synchronization with the first sub clock SC_L, and the fifth through eighth data D<4> through D<7> are latched in synchronization with the second sub clock SC_R.

The first bus 661 is connected to the first through fourth latching units 610_i (i is an integer from 0 through 3) that latch the first through fourth data D<j> (j is an integer from 1 through 4), respectively, and the second bus 662 is connected to the fifth through eighth latching units 610_i that latch the fifth through eighth data D<j>, respectively (j is an integer from 4 to 7). Accordingly, it is possible to reduce the numbers and lengths of the bit lines.

Each of the eight latching units 610_i includes one of the latches 620_i and one of the dummy input units 630_i (i is an integer from 1 through 8). The latches 620_i latch one data D<j> of a corresponding sub data group in synchronization with a corresponding sub clock SC_L or SC_R (i is an integer from 1 through 8 and j is an integer from 0 through 7). More specifically, the first through fourth latch 620_1 through 620_4 latch the first data D<0>, the second data D<1>, the third data D<2>, and the fourth data D<3> of the first sub data group, respectively, in synchronization with the first sub clock SC_L. The fifth through eighth latch 620_5 through 620_8 latch the fifth data D<4>, the sixth data D<5>, the seventh data D<6>, and the eighth data D<7> of the second sub data group, respectively, in synchronization with the second sub clock SC_R. The dummy input units 630_i may be any of the dummy devices described above in conjunction with other exemplary embodiments.

Each of the dummy input units 630_i is a circuit to which data, except for data latched by a corresponding latch 620_i, is input as dummy data (i is an integer from 1 through 8). More specifically, the first dummy input unit 630_1 receives the data D<1> through D<3>, except for the first data D<0> latched by the first latch 620_1, of the first sub data group. For instance, the second dummy input unit 630_2 receives the data D<0>, D<2>, and D<3>, except for the second data D<1> latched by the second latch 620_2, of the first sub data group. Likewise, the fifth dummy input unit 630_5 receives the data D<5> through D<7>, except for the fifth data D<4> latched by the fifth latch 620_5, of the second sub data group. The sixth dummy input unit 630_6 receives the data D<4>, D<6>, and D<7>, except for the sixth data D<5> latched by the sixth latch 620_6, of the second sub data group.

The first through fourth latching units 610_1 through 610_4 are connected to the first bus 661, i.e., bus lines for the first through fourth data D<0> through D<3>, and a bus line for the first sub clock. The fifth through eighth latching units 610_5 through 610_8 are connected to the second bus 662, i.e., bus lines for the fifth through eighth data D<4> through D<7>, and a bus line for the second sub clock. Accordingly, the data input circuit 600 according to an exemplary embodiment requires fewer and shorter bus lines connected to each latching unit. For example, nine bus lines are required in the data input circuit 500 but only five bus lines are required in the data input circuit 600. Also, each bus line in the data input circuit 600 is a half as long as each bus line in the data input circuit 500.

The repeating unit 650 is a circuit for amplifying the respective data D<j> (j is an integer from 0 through 7) and the first and second sub clocks SC_L and SC_R and includes ten repeaters. The number of the repeaters included in the repeating unit 650 is larger than that of the repeaters in the repeating unit 550 by one. Nevertheless, the length of each bus line connected to the repeaters 650 is a half of that of each bus line connected to the repeaters 550, thereby reducing driving loads weighed on the repeater 650. Therefore, power consumption in the data input circuit 600 is less than in the data input circuit 500.

In the exemplary embodiment of FIG. 6, data is divided into two sub data groups but the number of sub data groups is not limited. If necessary, the number of sub data groups can be variously determined.

Figure 7A:
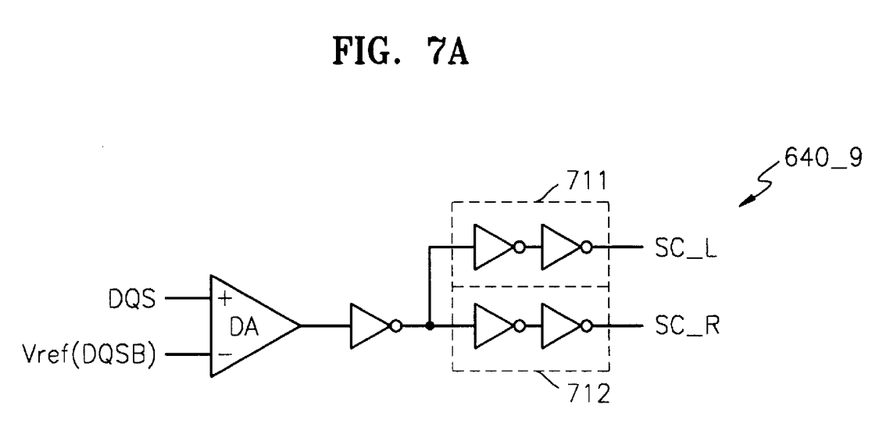
FIGS. 7(a) and (b) are circuit diagrams of a strobe signal inputting buffer and a data input buffer shown in FIG. 6, respectively.
Figure 7B:
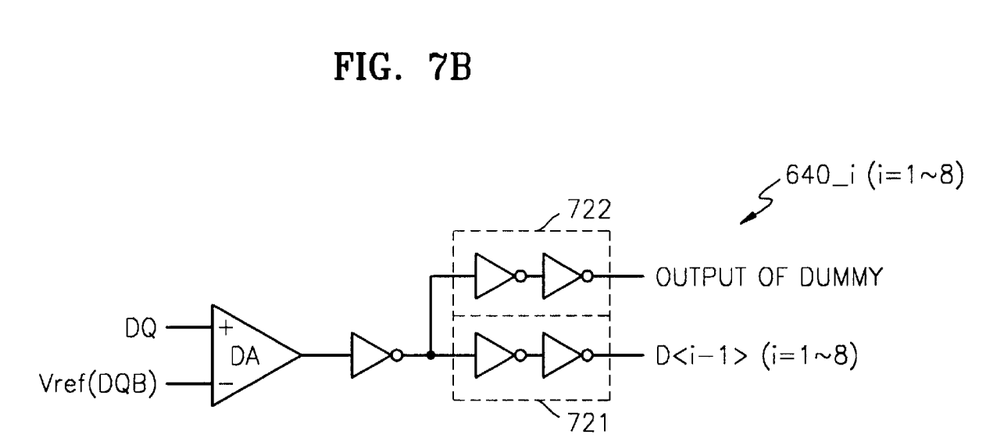

FIGS. 7(a) and 7(b) are diagrams illustrating examples of the strobe signal input buffer 640_9 and data input buffer 640_i (i is an integer from 1 through 8) which are shown in FIG. 6.

The strobe signal input buffer 640_9 includes a differential amplifier DA, a first sub clock generator 711, and a second sub clock generator 712. The differential amplifier DA compares a data strobe signal DQS with a reference voltage Vref and amplifies the data strobe signal DQS based on the comparison result so as to convert the data strobe signal DQS into an internal signal. The reference voltage Vref is a voltage signal of a predetermined level and may be an inversion signal DQSB of the data strobe signal DQS.

A signal output from the differential amplifier DA is input to the first and second sub clock generators 711 and 712 directly or via at least one inverter. The first and second sub clock generators 711 and 712 may be realized as at least one inverter. In an exemplary embodiment, the first and second sub clock generators 711 and 712 have the same or substantially the same structure, so that a delay time between an instant of time when the data strobe signal DQS is generated and a first sub clock SC_L, is the same as a delay time between the instant of time and a second sub clock SC_R.

The data input buffers 640_i (i is an integer from 1 through 8) have the same or substantially the same structures and each of the data input buffer 640_i includes a differential amplifier DA, a data generator 721, and a dummy output unit 722. In an exemplary embodiment, the structures of the data input buffers 640_i are the same or substantially the same as that of the strobe signal input buffer 640_9.

The differential amplifier DA converts external data DQ into an internal signal by comparing the external data DQ with the reference voltage Vref and amplifying the external data DQ based on the comparison result. Here, the reference voltage Vref denotes a voltage signal of a predetermined level and may be the inversion signal DQB of the external data DQ.

A signal output from the differential amplifier DA is input to the data generator 721 and the dummy output unit 722 directly or via at least one inverter. The data generator 721 and the dummy output unit 722 may be realized as at least one inverter, and have the same or substantially the same structures as the first and second sub clock generators 711 and 712. Using the dummy output unit 722 of the data input buffer 640_i, it is possible to make a load weighed on the data input buffer 640_i be identical or substantially identical with a load on the strobe signal input buffer 640_9 that has the first and second sub clock generators 711 and 712.

In an exemplary embodiment, a reference clock is divided into two sub clocks and data is classified into two sub data groups so as to reduce the length and number of bus lines, thereby reducing power consumption. Also, since the structure of each data input buffer is the same or substantially the same as that of a strobe signal input buffer that generates two sub clocks, a load between the reference clock and each data can be the same or substantially the same.

As described above, according to the present invention, it is possible to make a load on a reference clock be the same or substantially the same as that on each group of data in a circuit for latching multiple data with respect to the reference clock. Therefore, a load difference between the reference clock and each group of data is reduce to reduce a skew between the reference clock and each data. Also, the reference clock is divided into a plurality of sub clocks and multiple data is classified into a plurality of sub data groups so as to latch the multiple data per sub clock. Accordingly, a load difference between the reference clock and each data is reduced and power consumption is also reduced.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A data input circuit of a semiconductor device for latching a plurality of groups of data in response to a reference clock, the data input circuit comprising:
   first through $N^{th}$ latching units for latching each one of N groups of data in response to the reference clock, respectively, wherein N is a natural number greater than 2; and
   a bus for transmitting the reference clock and the N groups of data to the first through $N^{th}$ latching units,
   wherein each of the first through $N^{th}$ latching units includes:
      a clock buffer for buffering the reference clock;
      a data buffer for buffering a corresponding group of data of the N groups of data;
      N-1 dummy elements for respectively receiving each one of the N groups of data, except for the corresponding group of data input to the data buffer; and
      a latch for latching data output from the data buffer in synchronization with a signal output from the clock buffer.

2. The data input circuit of claim 1, wherein each of the dummy elements has the same or substantially the same capacitance as the clock buffer.

3. The data input circuit of claim 1, wherein each of the dummy elements is a buffer having the same or substantially the same structure and/or size as the clock buffer and the data buffer.

4. The data input circuit of claim 1, wherein each of the dummy elements is a capacitor that is formed between the bus and a grounding voltage.

5. The data input circuit of claim 1, wherein the each of the dummy elements includes:
   a pMOS transistor whose drain and source are connected to a power source and gate is connected to the bus; and
   an nMOS transistor whose drain and source are connected to a grounding voltage and gate is connected to the bus.

6. The data input circuit of claim 1, wherein the semiconductor device is a synchronous DRAM having a double data rate.

7. A data input circuit of a semiconductor device for latching a plurality of groups of data in response to a reference clock, the data input circuit comprising:
   first through $N^{th}$ latching units for respectively latching each one of N groups of data in response to the reference clock, wherein N is a natural number greater than 2; and
   a bus for transmitting the reference clock and the N groups of data to the first through $N^{th}$ latching units,
   wherein each of the first through $N^{th}$ latching units includes:
      a clock buffer for buffering the reference clock;
      a data buffer for buffering a corresponding group of data out of the N groups of data;
      N-1 dummy buffers for respectively buffering each one of the N groups data except for the corresponding group of data input to the data buffer; and
      a latch for latching data output from the data buffer in synchronization with a signal output from the clock buffer.

8. The data input circuit of claim 7, wherein each of the dummy buffers has the same or substantially the same structure and/or size as the clock buffer and the data buffer.

9. The data input circuit of claim 8, wherein each of the dummy buffers is an inverter-type buffer.

10. The data input circuit of claim 7, wherein the semiconductor device is a synchronous DRAM having a double data rate.

11. A data input circuit comprising:
   a plurality of data input buffers for buffering external data and outputting a plurality of groups of data that are divided into at least two sub data groups;
   a strobe signal input buffer for buffering a data strobe signal and generating at least two sub clocks;
   latching units for latching one group of data belonging to a corresponding sub data group of the at least two sub data groups in synchronization with the corresponding clock, and receiving other groups of data, except for the one group of data, as dummy data; and
   a bus for transmitting the at least two sub clocks and the at least two groups of sub data to a corresponding latching unit.

12. The data input circuit of claim 11, further comprising a plurality of amplifiers for amplifying the plurality of groups of data and the at least two clock signals.

13. The data input circuit of claim 11, wherein each of the data input buffers has the same or substantially the same structure as the strobe signal input buffer.

14. A data input circuit comprising:
   a plurality of data input buffers for buffering external data and outputting a plurality of groups of data;

a strobe signal input buffer for buffering a data strobe signal and generating first through $M^{th}$ sub clocks (M is a natural number greater than 2);

latching units for latching one of the plurality of groups of data in synchronization with the first through $M^{th}$ sub clocks, and receiving several groups of data of the plurality of groups of data as dummy data; and a bus for transmitting the first through the $M^{th}$ sub clocks and the plurality of groups of data to the latching units, wherein the latching units are divided into first through $M^{th}$ sub latch groups so as to divide the plurality of groups of data into first through $M^{th}$ sub data groups and latch the plurality of groups of data per sub data group (M is a natural number greater than 2), and the bus transmits the plurality of groups of data to the first through $M^{th}$ sub latch groups, the plurality of groups of data is latched per sub data group.

15. The data input circuit of claim 14, wherein each latching unit includes:

a latch for latching a group of data belonging to a corresponding sub data group; and a dummy input unit receiving other groups of data except for the one group of data belonging to the corresponding sub data group.

16. The data input circuit of claim 14, further comprising a plurality of amplifiers for amplifying the plurality of groups of data and the first through $M^{th}$ clock signals.

17. The data input circuit of claim 14, wherein each data input buffer has the same or substantially the same structure as the strobe signal input buffer.

18. The data input circuit of claim 17, wherein each data input buffer includes a dummy output unit whose path is the same as a path in which the plurality of groups of data are substantially generated.

19. The data input circuit of claim 14, wherein M is 2.

20. A data input circuit of a semiconductor device for latching a plurality of groups of data in response to a reference clock, the data input circuit comprising:

first through $N^{th}$ latching units for latching each one of N groups of data in response to the reference clock, respectively, wherein N is a natural number greater than 2; and a bus for transmitting the reference clock and the N groups of data to the first through $N^{th}$ latching units, wherein each of the first through $N^{th}$ latching units includes:

a clock buffer for buffering the reference clock;

a data buffer for buffering a corresponding group of data of the N groups of data;

N−1 load balancers for respectively receiving each one of the N groups of data, except for the corresponding group of data input to the data buffer; and a latch for latching data output from the data buffer in synchronization with a signal output from the clock buffer.

21. The data input circuit of claim 20, wherein the N−1 load balancers balance at least one of gate loading and bus loading.

22. The data input circuit of claim 20, wherein each of the N−1 load balancers has the same or substantially the same capacitance as the clock buffer.

23. The data input circuit of claim 20, wherein the N−1 load balancers are N−1 dummy elements.

24. The data input circuit of claim 23, wherein the N−1 dummy elements are N−1 capacitors.

25. The data input circuit of claim 20, wherein the N−1 load balancers are N−1 dummy buffers.

26. The data input circuit of claim 25, wherein each of the N−1 dummy buffers has the same or substantially the same structure and/or size as the clock buffer and the data buffer.

27. The data input circuit of claim 25, wherein the N−1 dummy buffers are N−1 inverters.

28. The data input circuit of claim 27, wherein each inverter includes at least one pMOS transistor and at least one nMOS transistor.

29. The data input circuit of claim 23, wherein each of the N−1 dummy elements includes a nPMOS transistor whose drain and source are connected to a power source voltage and whose gate is connected to the bus and an nMOS transistor whose drain and source are connected to a grounding voltage and whose gate is connected to the bus.

* * * * *